(12) United States Patent
Mikolajczak (10) Patent No.: US 11,585,861 B2
(45) Date of Patent: Feb. 21, 2023

(54) VEHICLE BATTERY PACK HEALTH MONITORING

(71) Applicant: Joby Aero, Inc., Santa Cruz, CA (US)

(72) Inventor: Celina J. Mikolajczak, San Carlos, CA (US)

(73) Assignee: Joby Aero, Inc., Santa Cruz, CA (US)

( * ) Notice: Subject to any disclaimer, the term of this patent is extended or adjusted under 35 U.S.C. 154(b) by 88 days.

(21) Appl. No.: 16/404,945

(22) Filed: May 7, 2019

(65) Prior Publication Data

US 2019/0339334 A1 Nov. 7, 2019

Related U.S. Application Data

(60) Provisional application No. 62/668,167, filed on May 7, 2018.

(51) Int. Cl.
*H01M 10/42* (2006.01)
*G01R 31/392* (2019.01)
(Continued)

(52) U.S. Cl.
CPC ............ *G01R 31/392* (2019.01); *B64C 29/00* (2013.01); *G01B 9/02* (2013.01); *G01R 31/371* (2019.01); *H01M 10/425* (2013.01); *H01M 10/482* (2013.01); *B64D 2045/0085* (2013.01); *H01M 2220/20* (2013.01)

(58) Field of Classification Search
CPC . G01R 31/392; G01R 31/371; H01M 10/482; H01M 10/425; H01M 2220/20; H01M 2200/00; H01M 2/34; H01M 2010/4278; G01B 9/02; G01B 7/18; G01B 11/161; G01B 11/16; B64C 29/00;
(Continued)

(56) References Cited

U.S. PATENT DOCUMENTS

2007/0298314 A1* 12/2007 Partin ................. H01M 50/572
429/62
2008/0114505 A1* 5/2008 Ishiba ................. G05D 1/0669
701/5
(Continued)

OTHER PUBLICATIONS

Uber, "Fast-Forwarding to a Future of On-Demand Urban Air Transportation", Uber Elevate, (Oct. 27, 2016), 98 pgs.

*Primary Examiner* — Cynthia K Walls
(74) *Attorney, Agent, or Firm* — Schwegman Lundberg & Woessner, P.A.

(57) ABSTRACT

Techniques are described for monitoring the degradation of electrochemical cells. A battery monitoring system monitors, for each of one or more cells of a plurality of cells in a battery, an amount of mechanical deformation using one or more measuring devices. The battery monitoring system determines a number of cells of the plurality of one or more monitored cells for which the monitored amount of mechanical deformation exceeds a deformation threshold. The battery monitoring system determines whether the determined number of cells exceeds a threshold number of cells with an amount of mechanical deformation exceeding the deformation threshold. Responsive to determining the determined number of cells exceeds the threshold number of cells, the battery monitoring system sends a notification that the battery is degraded beyond an acceptable limit.

5 Claims, 9 Drawing Sheets

(51) Int. Cl.
*G01R 31/371* (2019.01)
*H01M 10/48* (2006.01)
*G01B 9/02* (2022.01)
*B64C 29/00* (2006.01)
*B64D 45/00* (2006.01)

(58) Field of Classification Search
CPC ..... B64C 27/26; B64C 29/0033; B64C 27/30; B64D 2045/0085; B64D 27/24; Y02T 50/60
See application file for complete search history.

(56) References Cited

U.S. PATENT DOCUMENTS

2017/0309973 A1* 10/2017 Haug .................. H01M 10/488
2018/0208305 A1* 7/2018 Lloyd ..................... B60L 50/61

* cited by examiner

VEHICLE BATTERY PACK HEALTH MONITORING

BACKGROUND

1. Field of Disclosure

This disclosure relates generally to batteries and in particular to battery health monitoring.

2. Description of the Related Art

Electrochemical cells degrade over time, especially with use. As electrochemical cells degrade they may become unusable. If electrochemical cells are included in a battery that powers an electric vehicle, it may be important to occupants of the vehicle that the battery not degrade to an unusable state. For example, the degradation of the electrochemical cells in a battery powering an electric vertical takeoff and landing (VTOL) aircraft may lead to the VTOL aircraft losing the ability to take off, fly, or land. Electrochemical cells are typically stored in regions of an electric vehicle that are obscured from view or otherwise difficult to monitor, such as within the chassis of the electric vehicle beside and behind various other components of the electric vehicle.

SUMMARY

Embodiments relate to monitoring the degradation of electrochemical cells. A battery monitoring system monitors, for each of one or more cells of a plurality of cells in a battery, an amount of mechanical deformation using one or more measuring devices. Depending upon the embodiment, the one or more measuring devices can comprise at least one of a laser crossbeam detector, an impinging beam, a load cell, an interferometer, a linear variable differential transformer, and a camera.

The battery monitoring system determines a number of cells of the plurality of one or more monitored cells for which the monitored amount of mechanical deformation exceeds a deformation threshold. The battery monitoring system determines whether the determined number of cells exceeds a threshold number of cells with an amount of mechanical deformation exceeding the deformation threshold. Responsive to determining the determined number of cells exceeds the threshold number of cells, the battery monitoring system sends a notification that the battery is degraded beyond an acceptable limit. In an embodiment, the notification comprises preventing an electric vehicle from performing an action.

The figures depict embodiments of the invention for purposes of illustration only. One skilled in the art will readily recognize from the following description that alternative embodiments of the structures and methods illustrated herein may be employed without departing from the principles of the invention described herein.

DETAILED DESCRIPTION

Reference will now be made in detail to several embodiments, examples of which are illustrated in the accompanying figures. It is noted that wherever practicable similar or like reference numbers may be used in the figures and may indicate similar or like functionality. A letter after a reference numeral, such as "210A," indicates that the text refers specifically to the element having that particular reference numeral. A reference numeral in the text without a following letter, such as "210", refers to any or all of the elements in the figures bearing that reference numeral. For example, "210" refers to reference numerals "210A," "210B," and/or "210C" in the figures.

I. GENERAL OVERVIEW

Many electric vehicles, such as electric cars, boats, or aircraft, store electricity within a battery, or a battery pack that includes multiple batteries (henceforth, for the sake of this disclosure, discussion of a battery may further apply to a battery pack, and vice versa). Batteries contain electrochemical cells capable of providing electrical energy which can be used to power electric devices, including electric vehicles. Cells may be cylindrical cells, pouch cells, button cells, or prismatic cells, for example.

Electrochemical cells ("cells"), such as lithium-ion cells, degrade over time and can eventually reach a degree of degradation where a current interrupt device (CID) activates, cutting off the degraded cell from the rest of the battery. A CID is a physical component included in a cell that interrupts the current path through the cell upon the cell attaining a threshold internal pressure. For example, a CID may include two conductive plates through which electrical current passes, where the plates physically separate upon the cell reaching or surpassing a particular threshold internal pressure. Separation of the plates breaks the cell's circuit and thereby disconnects the cell from the rest of the battery. The threshold internal pressure may be predetermined by a producer of the cell. A CID may be constructed such that it physically activates upon its cell reaching or surpassing the threshold internal pressure.

Cell degradation can involve deformation (e.g., swelling) of the cell beyond its original size and shape. For example, a cylindrical cell may swell at its circular top or bottom, a pouch cell may swell at its edges, or a prismatic cell may swell at its sides. Cells degrade over time as they age and/or are used resulting in increased internal gas pressure. The internal gas pressure within a cell may be correlated to degree of capacity and impedance degradation of the cells, both of which may impact the usability or "health" of a cell. An increase in internal pressure can be detected by measurement of cell deformation. Various causes of increases to the internal gas pressure of a cell include the electrochemical oxidation of the electrolyte within the cell and overheating of the cell. Regardless of cause, cell deformation can be correlated with decreased cell health.

Cell degradation can be exasperated by high use actions that require high rates of electric discharge by a battery. Some electric vehicles perform such high use actions, for example, an electric vertical takeoff and landing (VTOL) aircraft when attempting a takeoff or landing maneuver. During a high use action, a battery with many degraded cells can completely fail when one of the degraded cells activates its CID. Disconnecting a single degraded cell within a parallel cell array places further strain upon the other cells of that array, which can lead to cascading failure of the rest of the cells in that array resulting in a loss of power to the vehicle. In situations such as a landing maneuver by a VTOL aircraft, loss of power may prove disastrous or even fatal to occupants of the aircraft.

As a simplified example, a vehicle with a battery that includes two somewhat degraded cells connected in parallel attempts a high use action. The high use action causes the first cell of the two to activate its CID, placing additional strain upon the second cell to provide the high rate of electric discharge needed for the high use action. This additional strain causes the second cell, which may have been only slightly less degraded than the first cell, to progress to a degree of degradation such that it too activates its CID, leaving the vehicle with no power source. In a similar manner, the cells of a battery with any number of cells connected in parallel may undergo cascading failure during high use actions.

Using one or more monitoring devices to monitor cells for degradation enables detection of situations where cascading failures may occur. For example, using an optical sensor (such as a laser range finder), interferometer, strain gauge, load cell (such as shear beam, double-ended shear beam, compression, S-type, or strain gauge load cell), linear variable differential transformer (LVDT), the reflecting intensity of an impinging beam, or one or more cameras to monitor changes in cell size and shape for one or more cells of a battery. As described above, tracing mechanical deformation of cells over time likewise traces their internal pressure, which measures the state of health of the battery (e.g., degree of capacity and impedance degradation). Monitoring for breaches of empirically determined mechanical deformation thresholds can inform that the battery is at risk for cascading failure.

For example, if 2% of the cells in a battery are monitored, and 50% of monitored cells have swollen to at least 10% beyond initial physical dimensions, the battery may be identified as unfit for use. In this example, the monitoring devices are laser range finders placed adjacent to monitored cells. If an initial range of a given cell is 10 micrometers, and later the range is 4 micrometers, it is evident that the given cell has swelled. If a deformation threshold for a cell is 1 micrometer of change in range, the given cell has surpassed it (having swelled 6 micrometers) and is therefore degraded beyond an acceptable amount (the deformation threshold, 1 micrometer). The threshold may be based upon a likelihood that the cell activates its CID upon mechanical deformation to the threshold extent. For example, the threshold may be empirically determined such that cells with mechanical deformation of at least the threshold amount have at least an X % likelihood of activating their CID upon next use, where X is either determined based on data (e.g., historic electric vehicle data, actuarial data, etc.), or is set by an administrator of a battery monitoring system, as described below. Although lengths and distances described herein are in terms of micrometers, in alternative embodiments the sizes of various components may vary, and may be larger or smaller than those measurements included herein.

A hardware and/or software system, referred to herein as a "battery monitoring system," communicatively coupled with the laser range finders may track each cell, monitoring how many of the cells breach the deformation threshold. If more than a threshold number (in this case, 50%) have deformed more than the threshold amount (in this case, swelling at least 10% on a face), the battery monitoring system sends a notification that the battery is at risk for cascading failure (e.g., a notification that the battery is degraded past an acceptable limit). The number of cells monitored may be, for example, the number that are necessary to perform a high use action, or a number of cells representative of the number necessary for a high use action.

The battery monitoring system can provide a notification of the state of the health of the battery pack to initiate a number of actions. In a first example, the notification can be sent to the vehicle display system to display a graphical indication of the battery's state of health. In another example, the notification can be provided to a service network in order to provide data that the network can use to coordinate operation of the vehicle and to make fleet-level decisions. The network can, for example, direct the vehicle to operate within a restricted flight envelope (including limiting power requirements) so that the vehicle does not risk causing a battery failure, coordinate inspection or replacement of the battery, or determine which veritports are accessible to the vehicle given the current battery health state or available flight envelope. In an embodiment, a vertiport is a VTOL node with at least one takeoff and landing pad as well as charging infrastructure to charge batteries.

II. SYSTEM OVERVIEW

Figure 1:
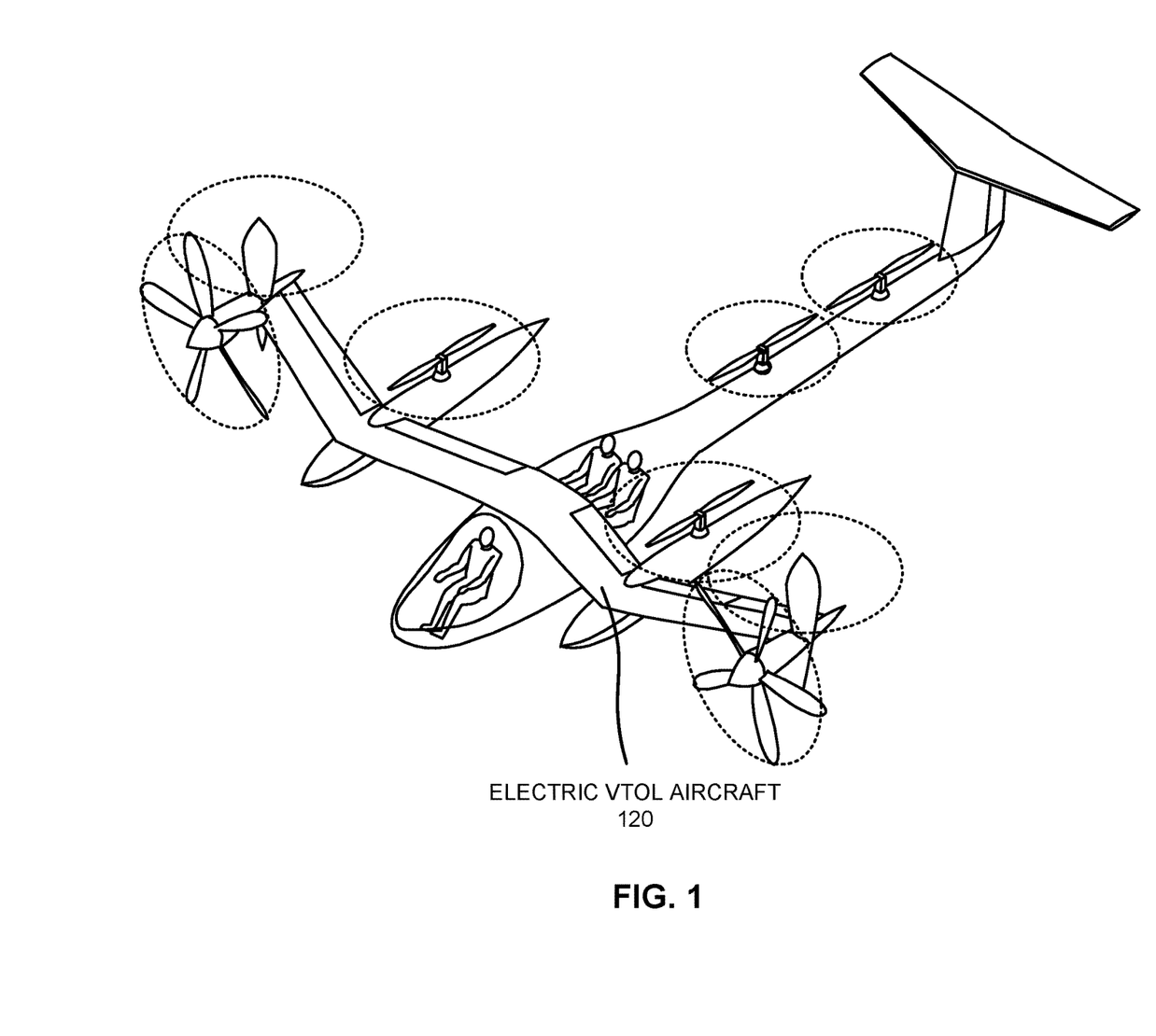
FIG. 1 illustrates an electric VTOL aircraft according to one embodiment.

FIG. 1 is illustrates an electric VTOL aircraft 120 according to one embodiment. In the embodiment shown in FIG. 1, the electric VTOL aircraft 120 is a battery-powered aircraft that transitions from a vertical take-off and landing state with stacked lift propellers to a cruise state on fixed wings. Electric VTOL aircraft 120 can include various components that run on electric power, such as rotor blades, ailerons, computing systems, communications systems, and lights. The electric VTOL aircraft 120 represented in FIG. 1 includes six rotors, though in alternative embodiments the electric VTOL aircraft 120 may include any number of rotor blades, as well as fewer, different, or additional components than those represented in FIG. 1. Although the present disclosure discusses electric VTOL aircraft 120, a person having ordinary skill in the art will recognize that the techniques described herein may equally apply to other electric vehicles with batteries, without loss of scope.

The electric VTOL aircraft 120 has an M-wing configuration such that the leading edge of each wing is located at an approximate midpoint of the wing. The wingspan of an electric VTOL aircraft 120 includes a cruise propeller at the end of each wing, a stacked wing propeller attached to each wing boom behind the middle of the wing, and wing control surfaces spanning the trailing edge of each wing. At the center of the wingspan is a fuselage with a passenger compartment that may be used to transport passengers and/or cargo. The electric VTOL aircraft 120 further includes two stacked tail propellers attached to the fuselage tail boom.

During vertical assent of the electric VTOL aircraft 120, rotating wingtip propellers on the nacelles are pitched upward at a 90-degree angle and stacked lift propellers are deployed from the wing and tail booms to provide lift. The hinged control surfaces tilt to control rotation about the vertical axis during takeoff. As the electric VTOL aircraft 120 transitions to a cruise configuration, the nacelles rotate downward to a zero-degree position such that the wingtip propellers are able to provide forward thrust. Control surfaces return to a neutral position with the wings, tail boom, and tail, and the stacked lift propellers stop rotating and retract into cavities in the wing booms and tail boom to reduce drag during forward flight.

During transition to a descent configuration, the stacked propellers are redeployed from the wing booms and tail boom and begin to rotate along the wings and tail to generate the lift required for descent. The nacelles rotate back upward to a 90-degree position and provide both thrust and lift during the transition. The hinged control surfaces on the wings are pitched downward to avoid the propeller wake, and the hinged surfaces on the tail boom and tail tilt for yaw control.

Commercial vehicles such as the electric VTOL aircraft 120 can be used to transport people and/or cargo. For example, a fleet of electric VTOL aircraft 120 in an urban area providing on-demand aviation could drastically reduce commute times. Safety and reliability are important not only to electric VTOL aircraft 120, but aircraft in general, and are especially important for aircraft that transport passengers.

Electric VTOL aircraft 120 are powered by electrical power stored in batteries, which degrade over time and eventually become unusable. Loss of power while in flight may be disastrous for passenger flights. Electric VTOL aircraft 120 perform high use actions regularly, such as taking off and landing, which electric VTOL aircraft 120 perform as part of each flight. High use actions have a greater risk of causing cascading failure of a battery due to the strain they place on the battery. Mitigating the chances of losing power by monitoring battery degradation thus improves both the safety and reliability of electric VTOL aircraft 120.

Figure 2:
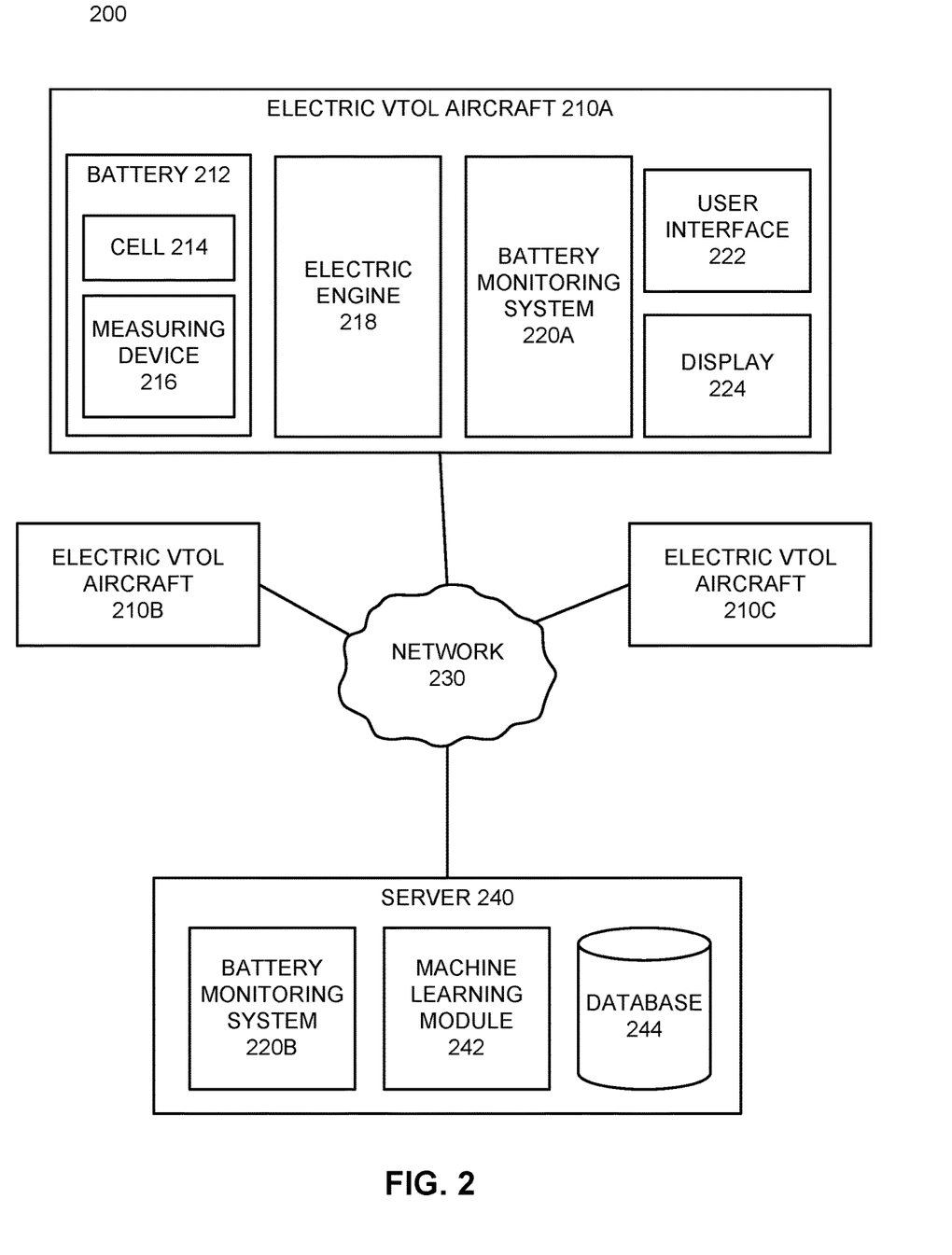
FIG. 2 is a block diagram illustrating an electric VTOL aircraft monitoring system, according to one embodiment.

FIG. 2 shows one embodiment of an electric VTOL aircraft monitoring system 200. In the embodiment shown, the electric VTOL aircraft monitoring system 200 includes three electric VTOL aircraft 210 and a server 240 connected by a network 230. Depending upon the embodiment, there may be fewer or more electric VTOL aircraft 210 than those illustrated in the figure, and one or more of them may be similar to electric VTOL aircraft 120. Furthermore, in alternative embodiments the server 240 may include more than one server 240, e.g., a distributed cloud server. Alternative embodiments may include fewer, different, or additional modules than those described herein, and may perform different or additional functionalities than those described herein. For clarity, various generic components, such as network adapters, are not described herein, and are understood to be known to a person having ordinary skill in the art.

The electric VTOL aircraft ("aircraft") 210A includes a battery 212, an electric engine 218, a battery monitoring system 220A, a user interface 222, and a display 224. The aircraft 210A operates using electric energy from the battery 212 that powers the electric engine 218. A pilot of the aircraft 210A can interact with the aircraft 210A using the user interface 222, which may comprise software and/or hardware and be part of or displayed upon the display 222. The user interface 222 generates and/or maintains graphical elements, such as text, symbols, images, and/or renderings, that represent information about the electric VTOL aircraft 210A and may be displayed at the display 224. The user interface 222 receives input from the pilot, such as instructions for take-off, landing, and flying maneuvers. The aircraft 210A responds to the received input, e.g., the electric engine 218 draws electricity from the battery 212 and powers one or more actions, such as the aforementioned flying maneuvers. Depending upon the embodiment, the aircraft 210A may include more than one electric engine 218. For example, different rotors each have a corresponding electric engine.

The battery 212 includes a cell 214 and a measuring device 216. As described in greater detail below, the measuring device 216 measures the health of the cell 214 and informs the battery monitoring system 220A of the health of the cell. The measurements may be periodic. For example, the measuring device 216 may make a measurement of the cell 214 once per second and send the measurement to the battery monitoring system 220.

The battery monitoring system 220 monitors the health of the cell and performs one or more safety actions based on the information received from the measuring device 216 regarding the health of the cell. In one embodiment, the battery monitoring system 220 sets a flag indicating that the cell 214 has breached a threshold for mechanical deformation, indicating that the cell 214 may be unsuitable for continued use, e.g., charging or operation. Once the flag has been set, the battery monitoring system 220 may prevent the aircraft 210A from performing certain operations (e.g., charging, taking off, etc.) until the battery 212 has been inspected and the battery 212 or one or more cells 214 have been either repaired, replaced, or cleared for additional use, e.g., by a mechanic. Alternatively or additionally, the battery monitoring system 220A may indicate to a user of the aircraft 210A via the display 224 that the cell 302 and/or the battery 300 is unfit for use. For example, if more than a threshold number of monitored cells 214 have surpassed their mechanical deformation thresholds (and/or a corresponding number of flags have been set), the battery monitoring system 220 may alert the pilot of the aircraft 210A that the aircraft 210A is unfit for flight, or, if already in air, that an emergency landing may be necessary. The battery monitoring system 220 may perform these techniques regardless of which measuring device 216 is used, e.g., based on notifications from any of the measuring devices described below, depending upon the embodiment.

In an embodiment, in response to determining that the threshold number of monitored cells 214 have surpassed their mechanical deformation thresholds, the battery monitoring system 220 checks whether the aircraft 210A is in flight. If the aircraft 210A is not in flight, the battery monitoring system 220 prevents use of the aircraft 210A for take-off or flight maneuvers. The battery monitoring system 220 may reset or be overridden by user input, e.g., instructions received via the user interface 222.

Depending upon the embodiment, the battery monitoring system 220 may exist solely upon the aircraft 210A or the server 240, or may be distributed across the aircraft 210A and the server 240. In embodiments where some or all of the battery monitoring system 220 is external to the aircraft 210A, the aircraft 210A communicates with the server 240 via the network 230, e.g., to send measurements from the measuring device 216 to the battery monitoring system 220B or to receive instructions for safety actions from the battery monitoring system 220A.

The network 230 may comprise any combination of local area and wide area networks employing wired or wireless communication links. For example, the network 230 includes communication links using technologies such as Ethernet, 802.11, worldwide interoperability for microwave access (WiMAX), 3G, 4G, code division multiple access (CDMA), digital subscriber line (DSL), etc. in example embodiments. Examples of networking protocols used for communicating via the network 230 can include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 230 may be represented using any format, such as hypertext markup language (HTML) or extensible markup language (XML). In some embodiments, all or some of the communication links of the network 230 may be encrypted.

The server 240 supports the functioning of the aircraft 210A, such as the battery monitoring system 220. In some embodiments, the aircraft monitoring system 200 does not include the server 240 or provide the functionality described with respect to the server 240. The server 240 comprises a battery monitoring system 220B, a machine learning module 242, and a database 244. The database 244 records data pertaining to aircraft 210A, and can record data pertaining to other aircraft (e.g., electric VTOL 210B, 210C) as well. For example, the database 244 may store historic data regarding cell 214 health. The historic data may include a series of periodic entries noting the number of cells 214 that have surpassed the threshold of mechanical deformation as of the time the entry was recorded at the database 244.

The machine learning module 242 uses the data in the database 244, e.g., the historic data for the aircraft 210A and potentially the historic data of other aircraft 210B,C, to model various scenarios, such as cascading failure of batteries 212, correlations between measurements of mechanical deformation and the likelihood that the CID of a cell 214 activates, and so on. The machine learning module 242 may produce models that may be used to determine a threshold of acceptable mechanical deformation for the cells 214 of the aircraft 210A. For example, the machine learning module 242 may train on data from the database 244, such as data pertaining to historic incidents of cascading failure, to generate models that characterize batteries 212, e.g., with respect to mechanical deformation of cells 214 and probabilities of cascading failure. For example, the models may be used to determine a threshold of mechanical deformation such that the likelihood that a high-use action causes cascading failure of the battery 212 is less than X % given that fewer than Y % or Z number of cells 214 have surpassed the determined threshold of mechanical deformation. In an embodiment, X, Y, and Z are set by an administrator of the server 240.

Figure 3:
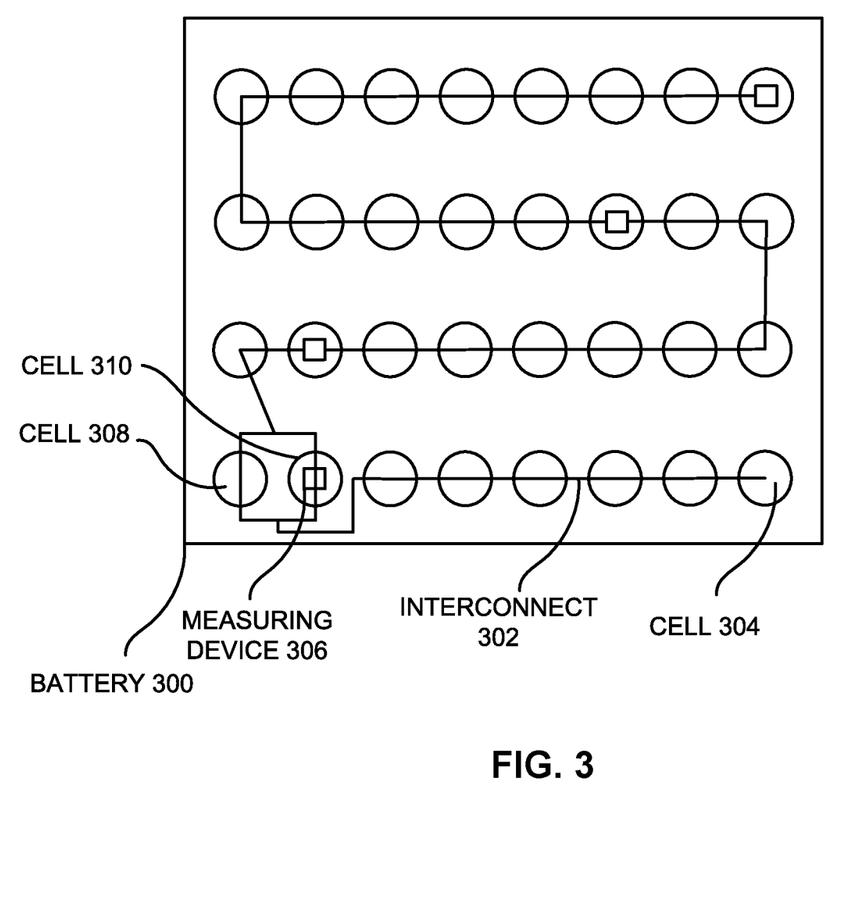
FIG. 3 is a simplified illustration of a battery, according to one embodiment.

FIG. 3 is a simplified illustration of a battery 300, according to one embodiment. The battery 300 includes cells, such as cell 304. The cells are interconnected via interconnect 302. In the example of the figure, the cells are interconnected in series, except for cells 308 and 310, which are interconnected in parallel. Depending upon the embodiment, other and/or additional interconnection configurations may be present, including any number of parallel and/or series interconnects among any number of cells. Measuring devices, such as measuring device 306, are placed at a subset of cells within the battery 300, or at locations within the battery such that one or more of the cells may be monitored by the measuring device. In the example of the figure, there are four measuring devices, one per row of cells. Depending upon the embodiment, there may be one measuring device per cell, one measuring device per row, one measuring device per series element, one measuring device per some other subset of cells, a measuring device for each cell in a certain subset of cells, or so on. For example, measuring devices could be spaced periodically, such as at every fourth cell in the battery 300. As another example, for measuring devices that can each monitor more than one cell at once, the measuring devices may be situated within the battery 300 such that every other row of cells is monitored by a measuring device.

In the embodiment shown each cell includes a CID. As mentioned above, a CID interrupts the current passing through the cell to which it is connected if the internal gas pressure in the cell exceeds a specified threshold. For example, the CID may be a pressure valve that permanently disables the cell if the pressure exceeds the specified limit by releasing the connection of one of the terminals of the cell (either positive or negative) rendering it unusable. The battery continues to operate despite one or more cells activating CIDs. In one embodiment, upon activation of a CID, the cell is shorted; the rest of the battery continues to operate as if the shorted cell were not present. As such, if, for example, the CID included in cell 308 were to activate, the battery 300 would continue operating without the cell 308. This would place greater strain upon cell 310, which is connected in parallel with cell 308, to make up for the electric discharge lost due to the disconnection of the cell 308. If cell 310 were then to fail, the circuit would be broken, as both cells 308 and 310 would be disconnected from the circuit and there would be no path through the parallel cells.

III. MEASURING TECHNIQUES

Figure 4:
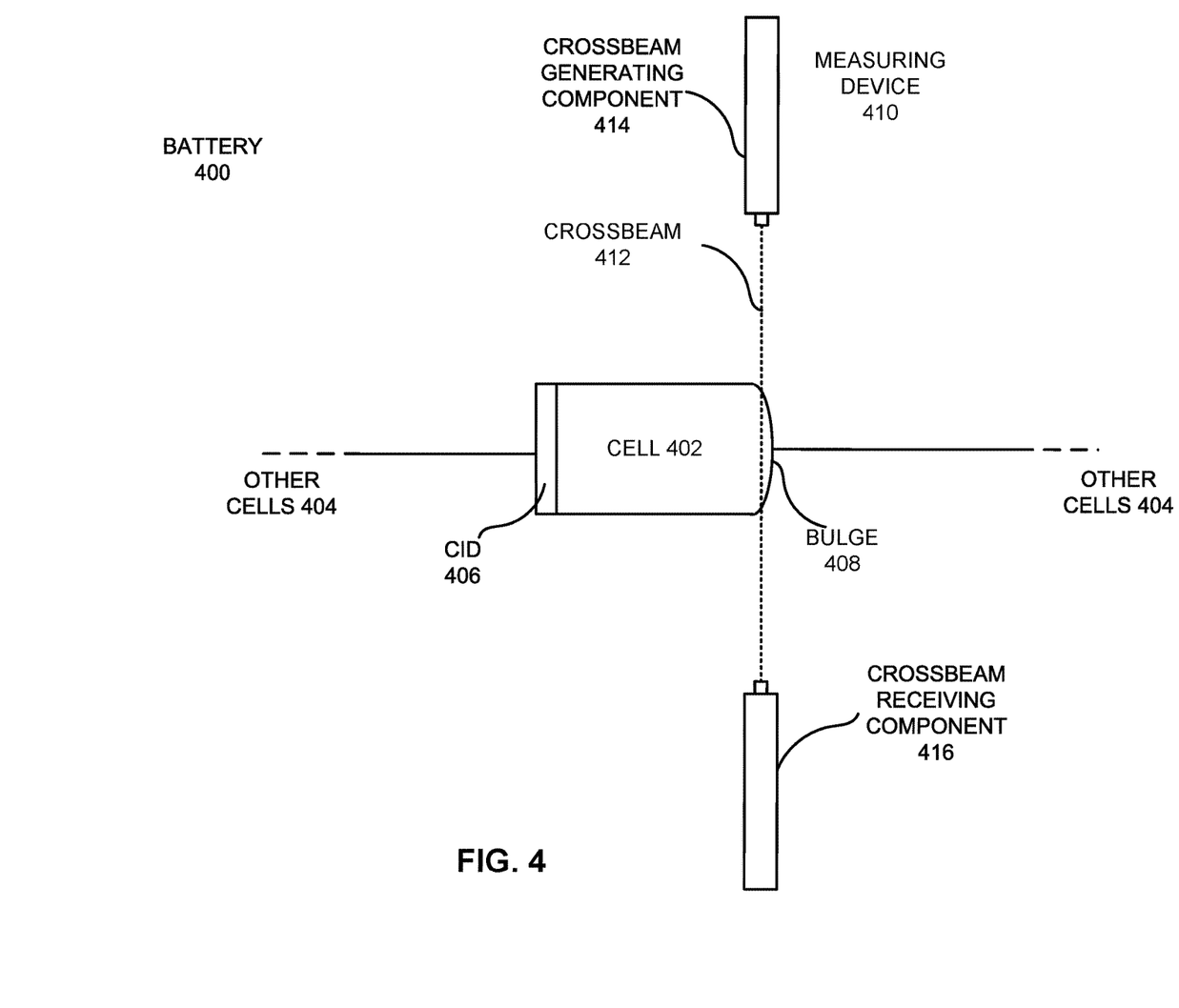
FIG. 4 is a simplified illustration of detecting mechanical deformation using laser crossbeam detection, according to one embodiment.

FIG. 4 is a simplified illustration of detecting mechanical deformation using laser crossbeam detection, according to one embodiment. Battery 400 includes a cell 402 that is connected to other cells 404. For example, battery 400 may be battery 300, where cell 402 is connected in series to cell 304, where cell 304 is one of the other cells 404. The particular structure and positioning of the components in FIG. 4 may vary depending upon the embodiment without departing from the techniques described herein.

The cell 402 has a CID 406 that can disconnect the cell 402 from one or more of the other cells 404, e.g., the rest of the battery 400. Degradation of the cell 402 is measured using measuring device 410. In the example of the figure, the measuring device 410 includes a laser crossbeam detector that detects when a threshold level of mechanical deformity has been reached or surpassed by the cell 402 due to its mechanical deformation as a result of degradation. In other embodiments other crossbeam detection techniques may be employed, for example, using an infrared beam instead of a laser beam.

The measuring device 410 generates a crossbeam 412 and detects if this crossbeam 412 is interrupted. For example, the measuring device 410 may comprise a crossbeam generating component 414 that generates the crossbeam 412 and a crossbeam receiving component 416 that detects whether the crossbeam 412 has reached it, e.g., reflected off or entered a face of the crossbeam receiving component 416.

The measuring device 410 is adjacent to the cell 402 such that the crossbeam 412 is at the threshold of mechanical deformity. Mechanical deformation of the cell 402 results in the cell 402 expanding beyond its initial physical dimensions. In FIG. 4, the cell 402 is a cylindrical cell with a flat top. As the cell 402 degrades, the top mechanically deforms, bulging such that it forms a dome shape rather than a flat surface, creating a bulge of one micrometer relative to the initial dimensions of the cell. Such a bulge is exemplified in the figure at bulge 408. For example, the cell 402 is 5 micrometers long, and the top mechanically deforms by expanding one micrometer, creating a bulge that has, at its greatest extent, extended one micrometer from the original plane of the previously flat top of the cell. If the threshold level of mechanical deformity is set at one micrometer of expansion at the top, the measuring device 410 is adjacent to the cell 402 such that the crossbeam 412 is one micrometer from the top of the cell 402. As such, the measuring device 410 is set to determine when the cell 402 mechanically deforms at least the threshold amount, because such a mechanical deformation breaches the crossbeam 412. In other words, once the deformation reaches the threshold amount, the detector of the measuring device 410 will stop receiving the crossbeam 412. Because the bulge 408 bulges one micrometer out perpendicularly from the original plane of the top of the cell, the crossbeam 412 is interrupted and measuring device 410 identifies cell 402 as having surpassed the threshold of mechanical deformity.

Depending upon the embodiment, the measuring device 410 may be used to monitor more than one cell 402 at a time. For example, in one embodiment, the measuring device 410 is adjacent to a row of cells 402 such that the crossbeam 412 is projected down the principle axis of the row at the threshold of mechanical deformity for the cells 402 in the row. If any of the cells 402 in the row reaches a degree of degradation such that a mechanical deformation breaches the crossbeam 412, the measuring device 410 detects a breach of the threshold of mechanical deformity. Thus, the system can determine that at least one of the cells 402 in the row has exceeded the threshold of mechanical deformity.

When the crossbeam 412 is interrupted by the bulge 408, the measuring device 410 notifies a battery monitoring system of the electric VTOL aircraft including the battery 400 that there is a breach of the threshold of mechanical deformity.

Figure 5:
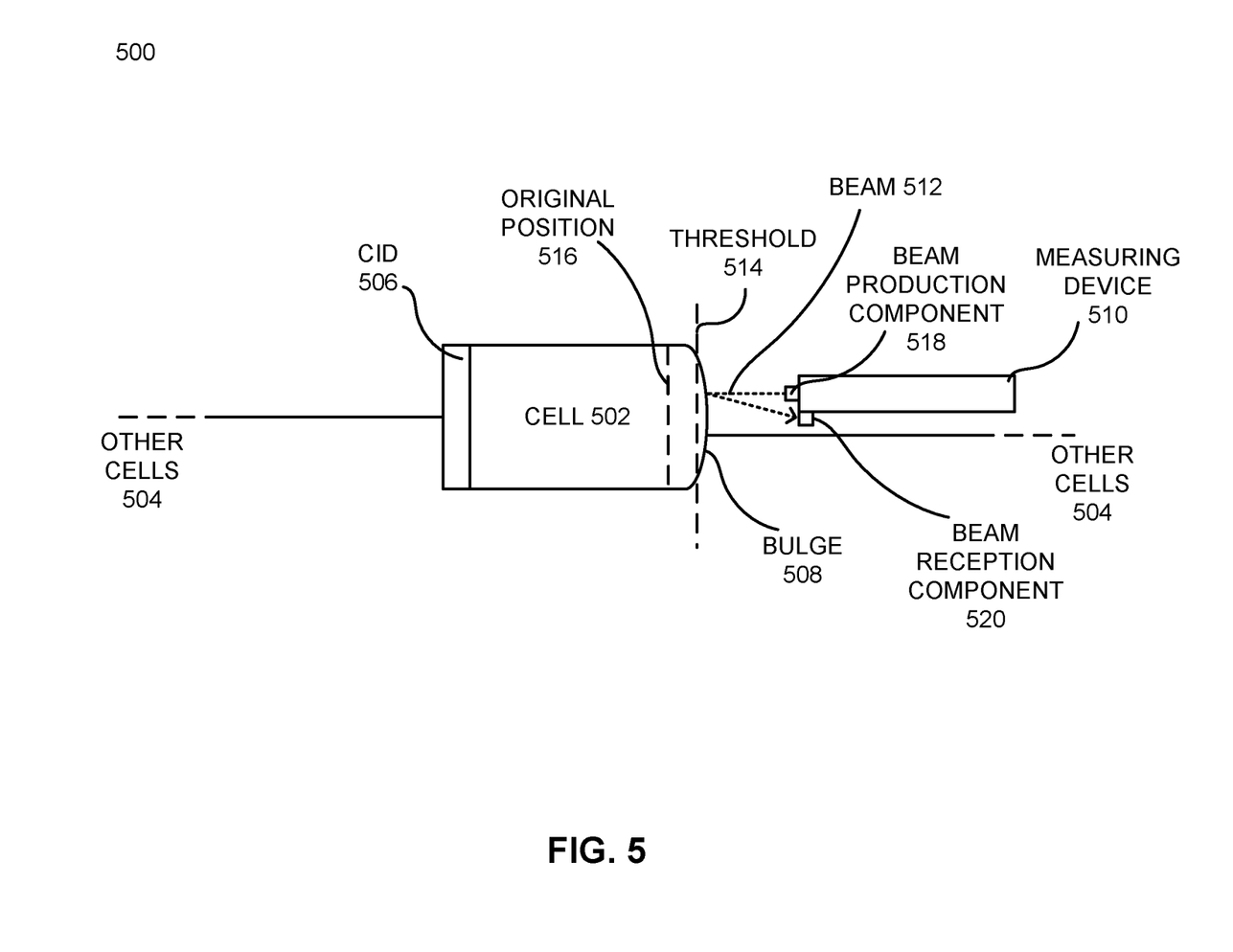
FIG. 5 is a simplified illustration of detecting mechanical deformation using an impinging beam, according to one embodiment.

FIG. 5 is a simplified illustration of detecting mechanical deformation 502 using an impinging beam, according to one embodiment. Battery 500 includes a cell 502 that is connected to other cells 504. For example, battery 500 may be battery 300, where cell 502 is connected in series to cell 304, where cell 304 is one of the other cells 504. The particular structure and positioning of the components in FIG. 5 may vary depending upon the embodiment without departing from the techniques described herein.

The cell 502 has a CID 506 that can disconnect the cell 502 from at least one of the other cells 504, e.g., upon the cell reaching or surpassing a threshold of mechanical deformity. Degradation of the cell 502 is measured using measuring device 510. In the example of the figure, the measuring device 510 includes a laser range finder that detects when a threshold level of mechanical deformity has been reached or surpassed by the cell 502 due to its mechanical deformation as a result of degradation. In other embodiments other range finding techniques may be employed, for example, using an infrared beam instead of a laser beam 412, or another device capable of generating a beam and receiving and analyzing a reflection thereof. The measuring device 510 may include a beam production component 518 that produces the beam 512 and a beam reception component 520 that detects when the beam 512 has reached it, e.g., reflected off or entered a face of the beam reception component 520. The beam reception component 520 determines a distance to the cell 502 from the measuring device 510 based on the time it takes for the beam 512 to reach the beam reception component 520 after its emission from the beam production component 518.

The measuring device 510 generates the beam 512 that is used to measure the distance from the measuring device 510 to a face of the cell 502. Mechanical deformity is measured based on the range determined, by the measuring device 510, from the measuring device 510 to the face of the cell 502 at which the measuring device 510 is pointed. For example, if an initial range is one micrometer, and the face of the cell 502 bulges such that the range changes to one half of an micrometer, the measuring device 510 detects that the cell 502 has mechanically deformed one half micrometer at that face, creating bulge 508.

The threshold of mechanical deformity may be set as a certain amount of change in range, or may be a specific range reading, depending upon the embodiment. In one embodiment, the threshold is one half micrometer of change, such that if a subsequent range reading is more than one half micrometer off from an initial reading, the measuring device 510 alerts the battery monitoring system that it detects a breach of the threshold. Alternatively, the threshold may be set at a specific range such that if the measuring device 510 measures that specific range, it alerts the battery monitoring system. For example, the measuring device 510 may be configured to alert the battery monitoring system if the measuring device 5410 ever determines the range to the face of the cell 502 is one half micrometer or less. The threshold of mechanical deformity is visualized in the figure as threshold 514, which is beyond the original position 516 of the face of the cell 502. Depending on the type of cell and nature of the expected use, different thresholds may be set; this applies to embodiments beyond that of FIG. 5.

Figure 6:
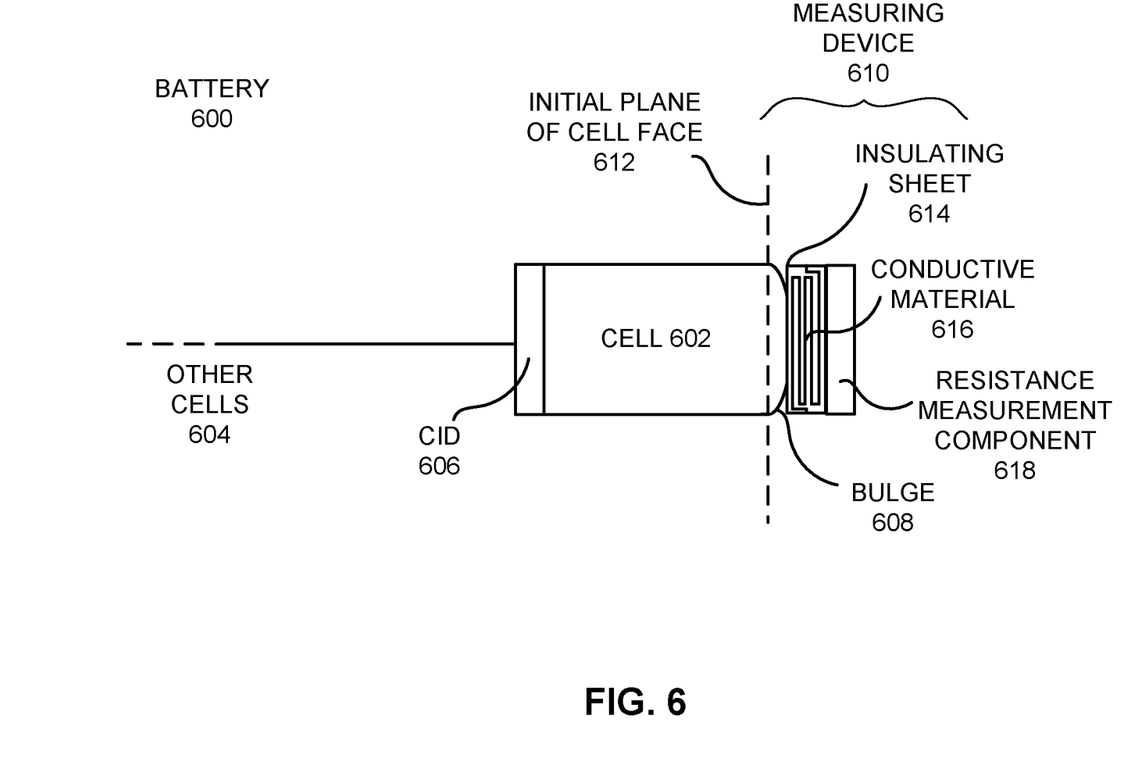
FIG. 6 is a simplified illustration of detecting mechanical deformation using a strain gauge, according to one embodiment.

FIG. 6 is a simplified illustration of detecting mechanical deformation using a strain gauge, according to one embodiment. Battery 600 includes a cell 602 that is connected to other cells 604. For example, battery 600 may be battery 300, where cell 602 is connected in series to cell 304, where cell 304 is one of the other cells 604. The particular structure and positioning of the components in FIG. 6 may vary depending upon the embodiment without departing from the techniques described herein.

The cell 602 has a CID 606 that can disconnect the cell 602 from at least one of the other cells 604. Degradation of the cell 602 is measured using measuring device 610. In the example of the figure, the cell 602 is mechanically deformed past the initial plane of the cell face 612, creating bulge 608.

In the example of the figure, the measuring device 610 includes a strain gauge that detects when a threshold level of mechanical deformity has been reached or surpassed by the cell 602 due to its mechanical deformation as a result of degradation. For example, the measuring device 610 may include a strain gauge including a flexible insulating sheet 614 with a pattern of conductive material 616 attached to a face of the sheet. The pattern may be a sinusoidal pattern with high amplitude and low wavelength to create a path across the face of the sheet 614 that is long relative to the size of the sheet, e.g., many times longer than the sheet's length, though the pattern may vary depending upon the embodiment. The measuring device 610 additionally includes a resistance measurement component 618 used to measure the electrical resistance of the strain gauge. As the strain gauge is mechanically deformed, its electrical resistance (e.g., across the conductive material 616) changes, which is measured by the resistance measurement component 618.

In alternative embodiments, load cells other than a strain gauge may be employed. Generally, the measuring device 610 may be any transducer that creates an electrical signal proportional to the mechanical deformation of the cell 602. In such alternative embodiments, the measuring device 610 may not include components such as the flexible insulating sheet 614 and the pattern of conductive material 616.

The measuring device 610, specifically the resistance measurement component 618, measures the change in electrical resistance of the strain gauge ("strain") to track the health of the cell 602. In such embodiments, mechanical deformity is measured in terms of strain, and the threshold of mechanical deformity is a threshold amount of strain as measured by the measuring device 610, e.g., a threshold amount of change in electrical resistance as compared to an initial electrical resistance. As the cell 602 degrades it mechanically deforms, which is contours the strain gauge and is therefore measured by the resistance measurement component as strain. If the threshold of mechanical deformity is reached or surpassed, the measuring device 610 alerts the battery monitoring system in a manner similar to previously discussed embodiments.

Figure 7:
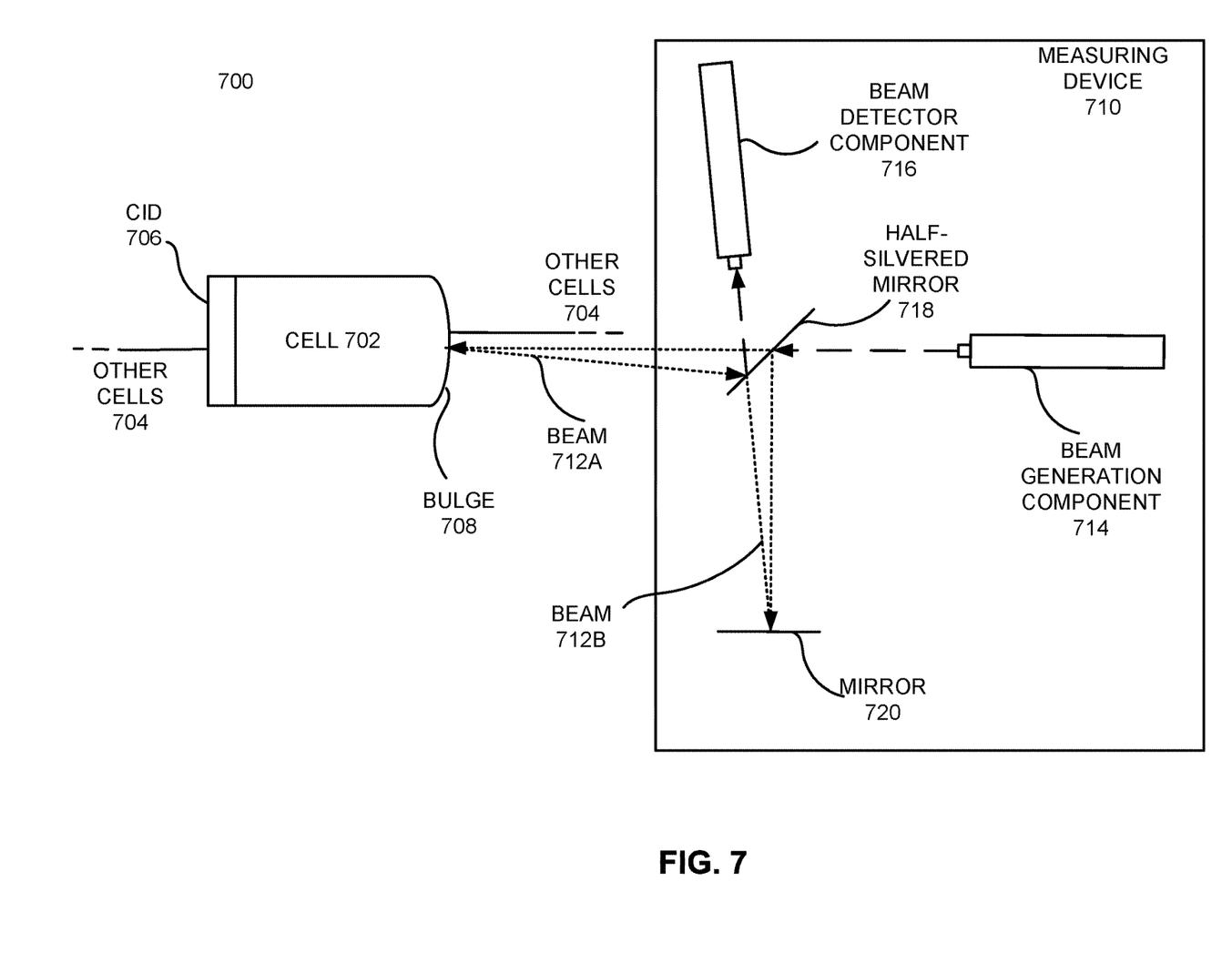
FIG. 7 is a simplified illustration of detecting mechanical deformation using an interferometer, according to one embodiment.

FIG. 7 is a simplified illustration of detecting mechanical deformation using an interferometer, according to one embodiment. Battery 700 includes a cell 702 that is connected to other cells 704. For example, battery 700 may be battery 300, where cell 702 is connected in series to cell 304, where cell 304 is one of the other cells 704. The particular structure and positioning of the components in FIG. 7 may vary depending upon the embodiment without departing from the techniques described herein.

The cell 702 has a CID 706 that can disconnect the cell 702 from at least one of the other cells 704. Degradation of the cell 702 is measured using measuring device 710. In the example of the figure, the measuring device 710 includes an interferometer that detects when a threshold level of mechanical deformity has been reached or surpassed by the cell 702 due to its mechanical deformation as a result of degradation.

For example, the measuring device 710 includes a beam generation component 714, a half-silvered mirror component 718, a mirror component 720, and a beam detector component 716. The beam generation component 714 generates a beam 712 that strikes the half-silvered mirror 718 and splits into beam 712A, which proceeds to strike the cell 702, and beam 712B, which proceeds to strike the mirror 720. Beams 712A,B return to the half-silvered mirror 718 upon reflecting off the cell 702 and the mirror 720, respectively, at which point the beams 712A,B coherently combine back into a singular beam 712 that enters the beam detector component 716. Because the beams 712 combine coherently, their amplitudes add constructively, meaning the amplitude of the overall beam 712 that enters the beam detector component 716 varies depending upon the relative phases of the two beams 712A,B when they recombine at the half-silvered mirror 718. The relative phases of the two beams 712A,B in turn depend upon the distance each beam travels before reflecting back towards the half-silvered mirror 718.

In the embodiment shown, the measuring device 710 measures the mechanical deformation of the cell 702 using interferometry. Mechanical deformation of the cell 702 leads to interference between two beams 712, with greater mechanical deformation causing greater interference due to the offset caused by the shorter distance to a point of reflection for the beam 712A that strikes the cell 702, at the bulge 708, than for the other beam 712B, which has a constant distance based on the position of the mirror 720. The distance to the point of reflection for the cell 702 is shorter after mechanical deformation because the bulge 708 expands a cell face towards the measuring device 710 closer than the cell's initial physical dimensions. The threshold of mechanical deformation in this embodiment is a threshold amount of interference. When the measuring device 710 detects the threshold amount of interference has been reached or surpassed, it alerts the battery monitoring system, similar to previously discussed embodiments.

Figure 8:
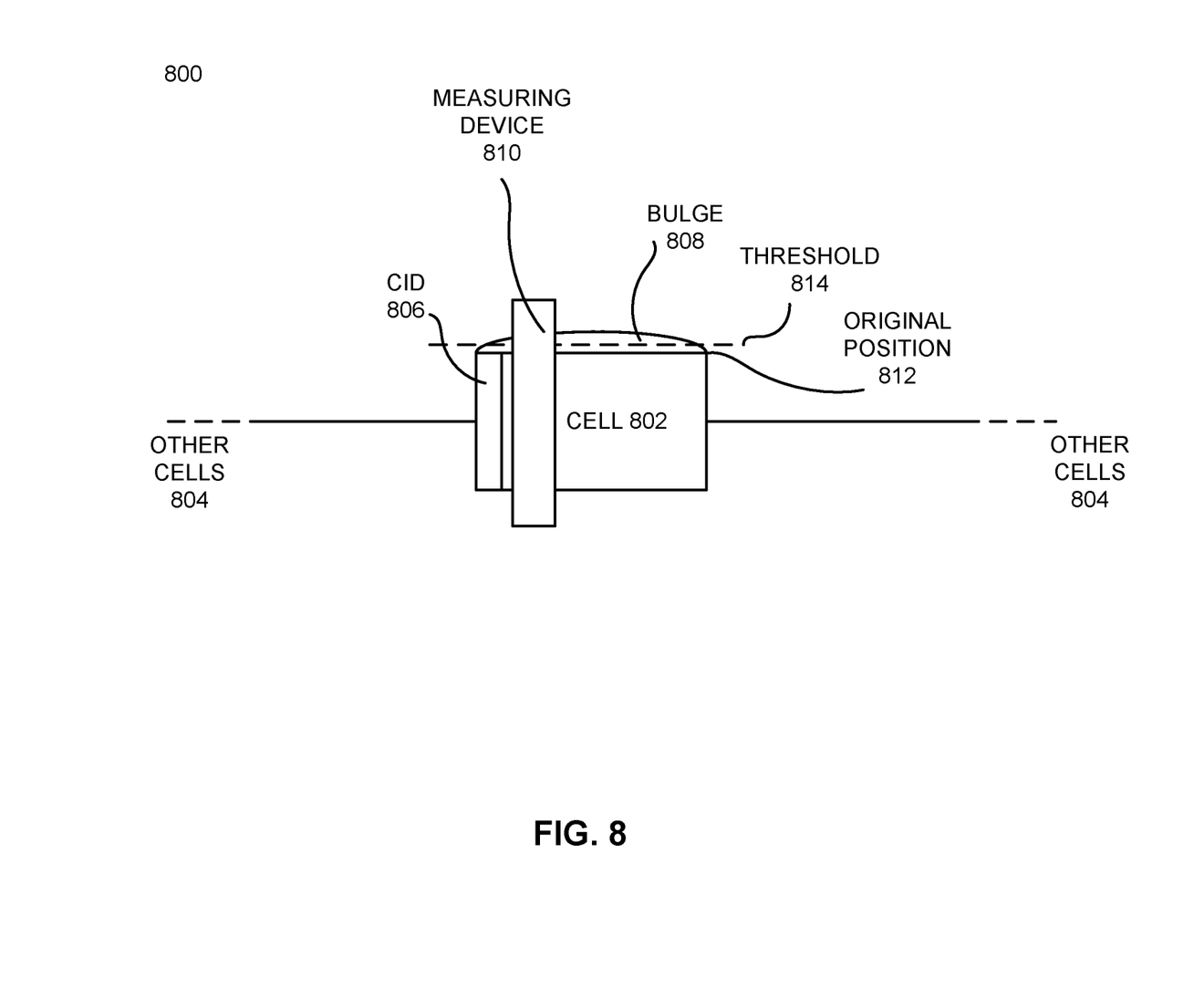
FIG. 8 is a simplified illustration of detecting mechanical deformation using a linear variable differential transformer, according to one embodiment.

FIG. 8 is a simplified illustration of detecting mechanical deformation using an LVDT, according to one embodiment. An LVDT is an electromechanical transducer that can convert the rectilinear motion of an object to which it is coupled mechanically into a corresponding electrical signal. For example, the LVDT in FIG. 8 is coupled mechanically to the cell 802 which, upon expansion, induces the LVDT to produce an electrical signal.

Battery 800 includes a cell 802 that is connected to other cells 804. For example, battery 800 may be battery 300, where cell 802 is connected in series to cell 304, where cell 304 is one of the other cells 804. The particular structure and positioning of the components in FIG. 8 may vary depending upon the embodiment without departing from the techniques described herein.

The cell 802 has a CID 806 that can disconnect the cell 802 from at least one of the other cells 804. Degradation of the cell 802 is measured using measuring device 810. In the example of the figure, the measuring device 810 includes an LVDT that detects when a threshold level of electrical signal has been produced or surpassed by the cell 802 due to its mechanical deformation as a result of degradation, which causes the LVDT to produce said electrical signal. When the measuring device 810 detects the threshold amount of interference has been reached or surpassed, it alerts the battery monitoring system, similar to previously discussed embodiments.

In another embodiment, the measuring device is a camera positioned such that it may video record one or more cells. A machine learning model may be generated by the server to analyze video recorded by the camera to determine whether one or more cells observed by the camera have reached or surpassed the threshold of mechanical deformation. Alternatively, the model may be video analysis software, or the video may be analyzed by a human analyst, where the human analyst inputs analysis results into the server, e.g., for use by the battery monitoring system.

IV. PROCESSES

Figure 9:
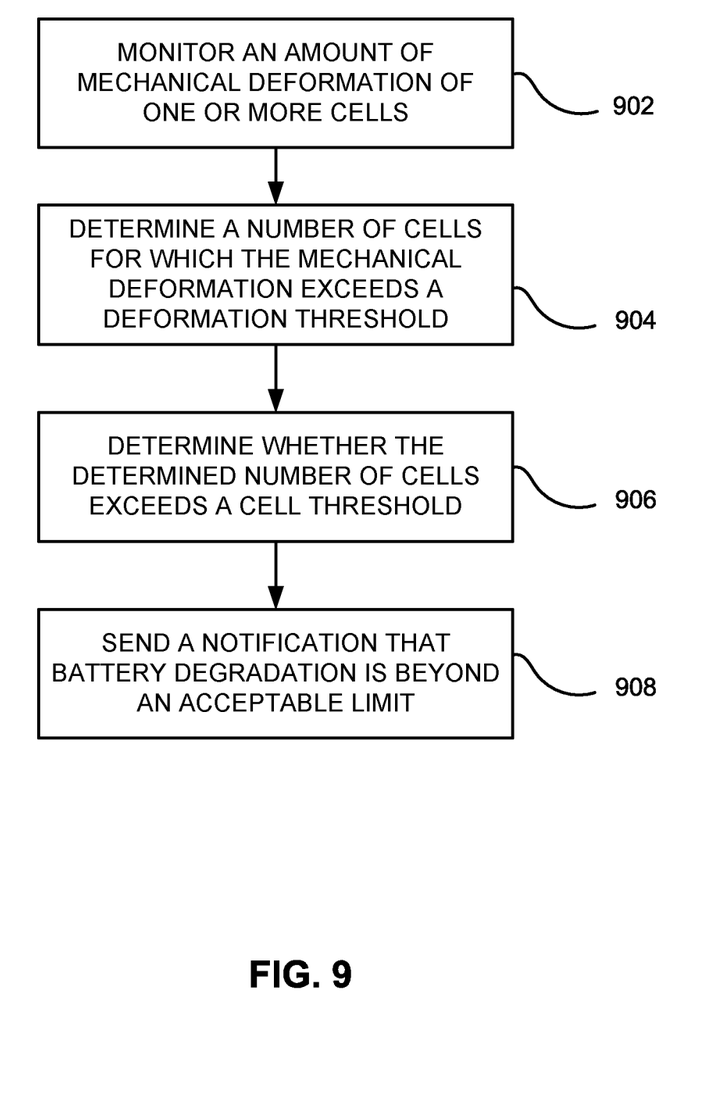
FIG. 9 illustrates a process for monitoring battery health, according to one embodiment.

FIG. 9 illustrates a process for monitoring battery health, according to one embodiment. An amount of mechanical deformation is monitored 902 for each of one or more cells in a battery. A number of cells of the plurality of cells for which the mechanical deformation reaches or exceeds a deformation threshold is determined 904. It is determined 906 whether the determined number of cells reaches or exceeds a cell threshold. If the number of cells that have reached or exceeded the deformation threshold exceeds the cell threshold, a notification is sent 908 that the battery has degraded beyond an acceptable limit. In an embodiment, determining whether the determined number of cells reaches or exceeds the cell threshold comprises comparing the determined number of cells to the cell threshold.

V. ADDITIONAL CONSIDERATIONS

The Figures and the accompanying description describe certain embodiments by way of illustration only. One skilled in the art will readily recognize from the following description that alternative embodiments of the structures and methods illustrated herein may be employed without departing from the principles described herein. Reference will now be made to several embodiments, examples of which are illustrated in the accompanying figures. It is noted that wherever practicable similar or like reference numbers may be used in the figures and may indicate similar or like functionality.

The description has been presented for the purpose of illustration; it is not intended to be exhaustive or to limit the invention to the precise forms disclosed. Persons skilled in the relevant art can appreciate that many modifications and variations are possible in light of the above disclosure.

Aspects of the invention, such as software for implementing the processes described herein, may be embodied in a non-transitory tangible computer readable storage medium or any type of media suitable for storing electronic instructions which may be coupled to a computer system bus. Furthermore, any computing systems referred to in the specification may include a single processor or may be architectures employing multiple processor designs for increased computing capability.

Finally, the language used in the specification has been principally selected for readability and instructional purposes, and it may not have been selected to delineate or circumscribe the inventive subject matter. It is therefore intended that the scope of the invention be limited not by this detailed description but rather by any claims that issue on an application based hereon. Accordingly, the disclosure of the embodiments of the invention is intended to be illustrative but not limiting of the scope of the invention.

What is claimed is:

1. A method of operating an electric vertical takeoff and landing (VTOL) aircraft, the method comprising:
    monitoring an amount of mechanical deformation of each cell of a plurality of cells in a battery, the monitoring of each cell of the plurality of cells in the battery being performed using a measuring device;
    determining, by a battery monitoring system, a number of cells of the plurality of cells for which the amount of mechanical deformation exceeds a deformation threshold;
    determining, by the battery monitoring system, that the determined number of cells exceeds a threshold number of cells with the amount of mechanical deformation exceeding the deformation threshold; and
    responsive to the battery monitoring system determining that the determined number of cells exceeds the threshold number of cells, using the battery monitoring system, automatically performing one or more safety actions related to the electric vertical takeoff and landing (VTOL) aircraft, the one or more safety actions comprising preventing the electric vertical takeoff and landing (VTOL) aircraft from performing at least one of a take-off or flight maneuver.

2. The method of claim 1, wherein the measuring device comprises at least one of laser crossbeam detector, an impinging beam, a load cell, an interferometer, a linear variable differential transformer, and a camera.

3. The method of claim 1, wherein each cell of the plurality of cells comprises a current interrupt device.

4. The method of claim 1, wherein the one or more safety actions comprises sending, using the battery monitoring system, a graphical indication to a user interface that the battery is degraded beyond an acceptable limit.

5. The method of claim 4, wherein the graphical indication is to alert a pilot perform an emergency landing of the electric vertical takeoff and landing (VTOL) aircraft.

* * * * *